(12) United States Patent
McLoughlin

(10) Patent No.: US 6,307,462 B2
(45) Date of Patent: Oct. 23, 2001

(54) LOW PROFILE MOUNT FOR METAL OXIDE VARISTOR PACKAGE WITH SHORT CIRCUIT PROTECTION AND METHOD

(75) Inventor: Neil McLoughlin, Blackrock (IE)

(73) Assignee: Harris Ireland Development Company Ltd., Dundalk (IE)

( * ) Notice: Subject to any disclaimer, the term of this patent is extended or adjusted under 35 U.S.C. 154(b) by 0 days.

(21) Appl. No.: 09/842,926

(22) Filed: Apr. 27, 2001

Related U.S. Application Data

(62) Division of application No. 09/401,497, filed on Sep. 22, 1999.

(51) Int. Cl.[7] ............................................. H01L 7/13
(52) U.S. Cl. ............................... 338/21; 338/20; 337/32; 337/34
(58) Field of Search ................... 337/32, 34; 361/124, 361/125; 338/20, 21

(56) References Cited

U.S. PATENT DOCUMENTS

| | | | |
|---|---|---|---|
| 4,212,045 | * | 7/1980 | Martzloff ............................ 361/127 |
| 4,233,641 | * | 11/1980 | Baumbach ........................... 361/119 |
| 4,887,183 | * | 12/1989 | Biederstedt et al. ................. 361/124 |
| 4,912,592 | * | 3/1990 | Flindall et al. ...................... 361/120 |
| 5,029,302 | * | 7/1991 | Masghati et al. ..................... 337/32 |
| 5,901,027 | * | 5/1999 | Ziegler et al. ....................... 361/124 |
| 6,204,746 | * | 3/2001 | Kane et al. ............................ 337/32 |

* cited by examiner

*Primary Examiner*—Karl D. Easthom
(74) *Attorney, Agent, or Firm*—Carter, Ledyard & Milburn

(57) ABSTRACT

A low profile mount for a disc varistor. A thermally sensitive switch is provided both for single and multiple electrode embodiments. The switch may be placed in a shorting circuit and include a spring biased conductor prevented from closure by a heat sensitive element which softens in responsive to excessive heat. The varistor may be fused to prevent excessive current from a short circuited but not open circuited varistor. Methods are also provided.

22 Claims, 6 Drawing Sheets

LOW PROFILE MOUNT FOR METAL OXIDE VARISTOR PACKAGE WITH SHORT CIRCUIT PROTECTION AND METHOD

This is a division, of application Ser. No. 09/401,497, filed Sep. 22, 1999.

BACKGROUND OF THE INVENTION

This invention relates to a surface mount for an electrical component and more particularly to a surface mount for a metal oxide varistor.

Surface mounting of components on printed circuit boards is common and it is desirable that the mounts be low in profile so that the distance between boards can be minimized and the size of the electronic chassis thus reduced. Where the electrical component is a thin element such as a disc with electrodes on both flat sides, low profile mounts are particularly desirable.

It is also desirable that the number of components required for mounting be minimized because of the area on the circuit board each component occupies. Thus it is highly desirable that the mount be compatible with components having multiple electrodes.

The thermal characteristics of the electrical components is generally a concern and it is desirable that the surface mount be compatible with, or integrated with one or more thermally sensitive switches. The thermal characteristics for many electrical circuit components such as varistors are particularly important where the component is coated with epoxy. In the event of a sustained overvoltage condition across the component, the current through the component can cause the temperature to increase sufficiently to cause the epoxy coating to smoke or ignite. Similarly, the epoxy coating can smoke or ignite in the event the component is subjected to a significant current pulse such that the component internally shorts but does not destruct, i.e., does not open-circuit.

The current solution to this overheating problem is to wire in series with the component a thermal cutout device in sufficiently close physical proximity to respond to the heat in the component to short circuit and thereby disconnect the component. This solution requires the addition of extra components and increases the cost and complexity of the circuit. Since great care must be taken to keep the thermal cutout device in close physical proximity to the component to preserve the responsiveness without overreacting, interference may occur with any surface mount.

Additionally, the "thermal connection" between the component and the thermal cutout device may be difficult to optimize in a surface mount.

Finally, low temperature thermal cutout devices may not be able to survive the soldering operation required to attach the component to a printed circuit board or the like, and a surface mount to which the component may be mounted without soldering is highly desirable.

Many of the above problems are exacerbated where the electrical component is a disc varistor. Disc varistors are well known and generally comprise a thin disc of a metal oxide or other voltage variable resistive material with an electrode on opposite flat sides of the varistor material. Known surface mounts for the smaller sizes, e.g., 7–10 mm, generally include a molded plastic body into which spring electrodes exiting the sides of the body are internally exposed in position to be contacted by the electrodes of the disc varistor when inserted therebetween from the front of the body.

One example of such prior art mount is illustrated in FIGS. 1 and 2 where the disc varistor 18 comprises a disc of varistor material 20 with surface electrodes 22 and 24 on the flat sides thereof. The varistor 18 may be inserted into the front opening of a plastic body 26 which carries a top contact 28 and a bottom contact 30 conveniently spring biased toward each other and separated by the insertion of the disc varistor. The ends of the contacts 32, 34 may be used to electrically connect the circuit to other components on the printed circuit board on which the body 26 may be mounted. Such mounts are expensive to manufacture and are generally higher in profile than desired. Moreover, they do not provide for multiple electrodes, for temperature protection or for a fuse.

Accordingly, it is an object of the present invention to obviate many of the above problems and to provide a novel surface mount and method for an electrical component on a printed circuit board.

It is another object of the present invention to provide a novel surface mount and method in which the mount is low profile.

It is still another object of the present invention to provide a novel surface mount and method in which the component may be connected without soldering.

It is yet another object of the present invention to provide a novel surface mount and method which is readily adapted for multiple electrical connections.

It is yet still another object of the present invention to provide a novel surface mount and method which is compatible with a thermal switch.

It is a further object of the present invention to provide a novel surface mount which is inexpensive and simple in construction.

It is yet a further object of the present invention to provide a novel surface mount and method which short circuit protection is available.

It is still a further object of the present invention to provide a novel surface mount and method in which the mount may be coated with a moisture barrier and/or have edge passivation.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
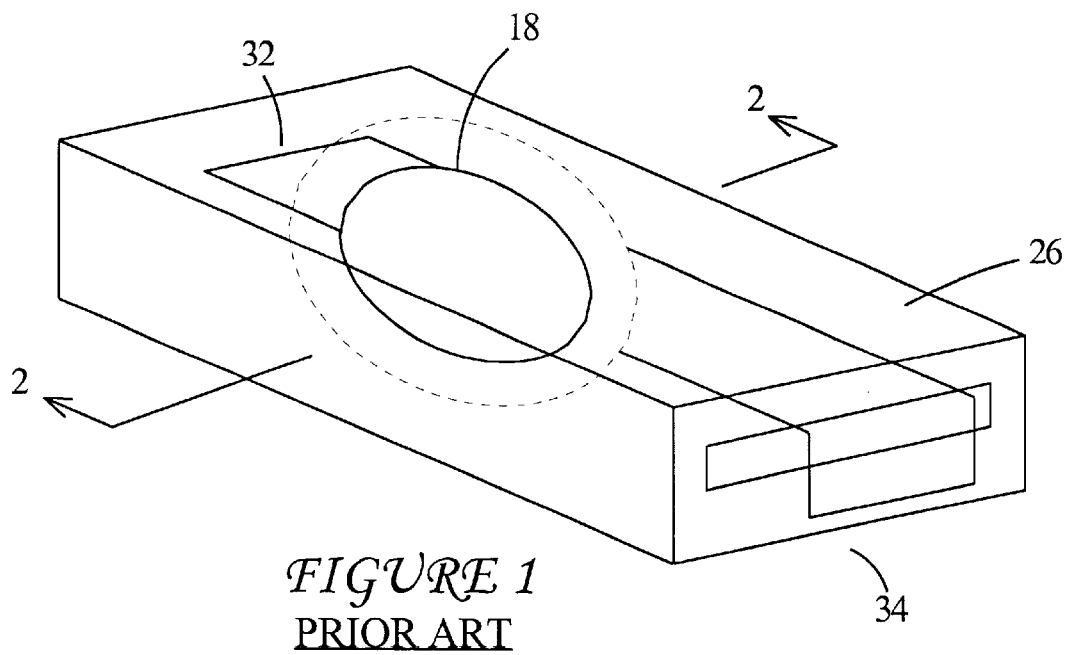
FIG. 1 is a pictorial view of a prior art surface mount package for a varistor disc.
Figure 2:
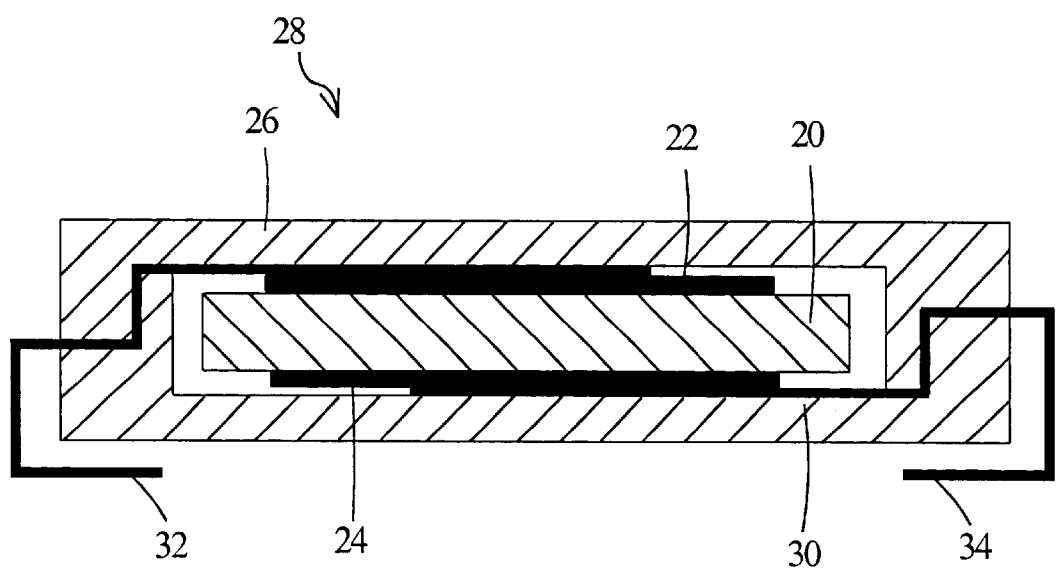
FIG. 2 is a section in elevation taken through lines 2—2 of FIG. 1.
Figure 3:
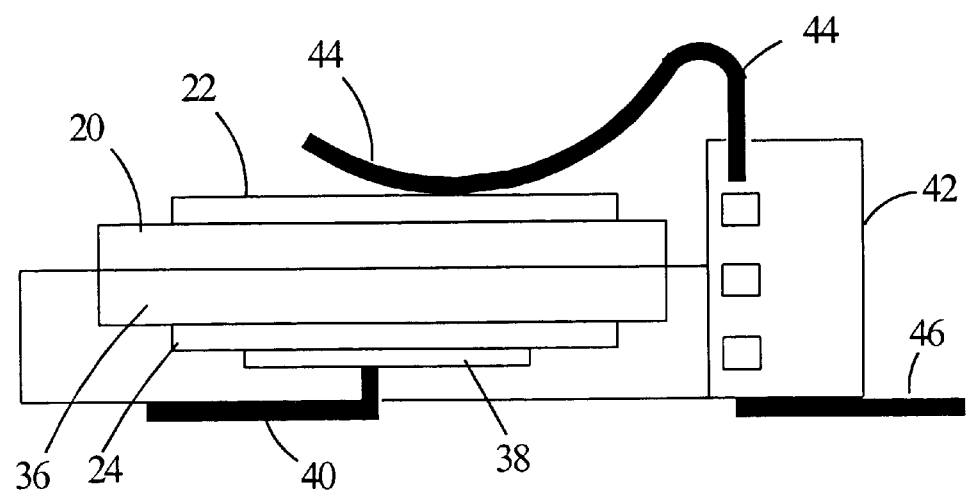
FIG. 3 is a side view in elevation of one embodiment of the surface mount of the present invention.
Figure 3A:
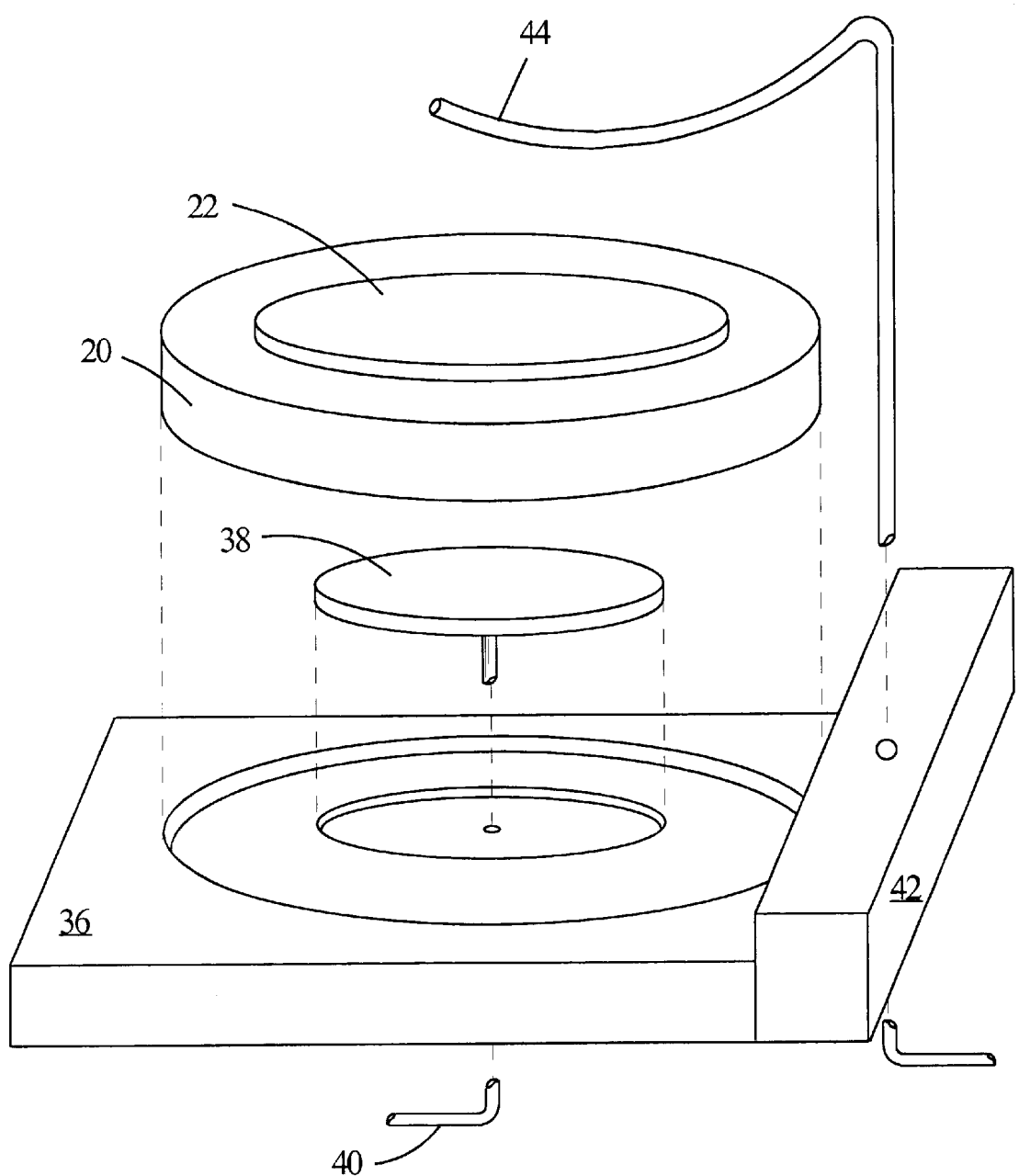
FIG. 3A is an exploded pictorial view of the mount of FIG. 3.
Figure 5:
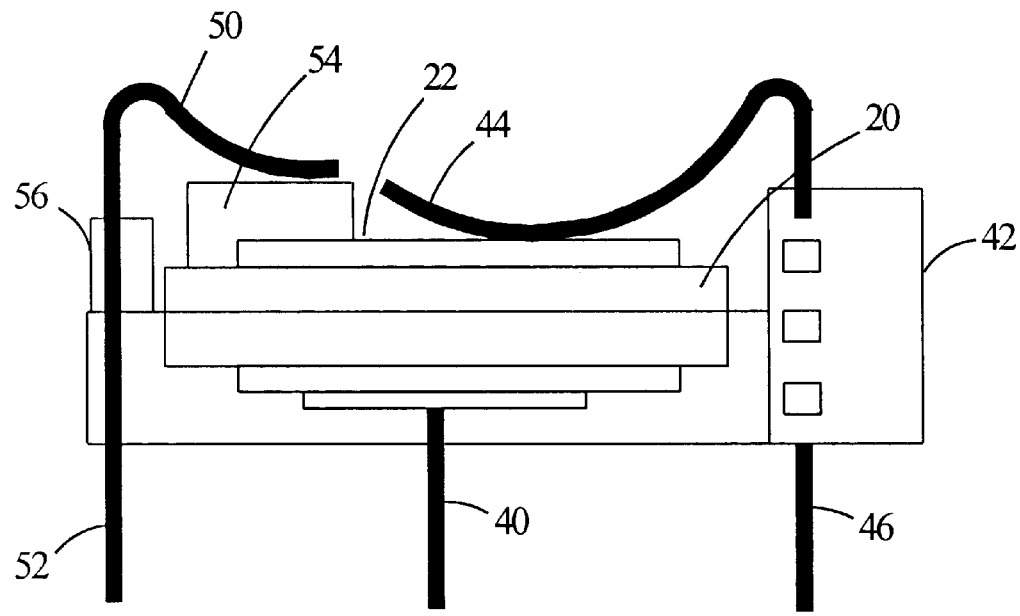
FIG. 5 is a side view in elevation of the embodiment of FIG. 4 with a thermal switch in the open position.

With reference to FIGS. 3 and 3A, a preferred embodiment of the mount of the present invention includes a molded plastic body 36 with a central circular depression dimensioned to receive a disc varistor 18 (varistor material 20 and electrodes 22 and 24) to a depth of about one-half the thickness thereof. Centrally located within the depression is a second depression adapted to receive a circular contact 38 which exits the body 36 to provide a first lead 40. The contact 38 desirably extends upwardly above the bottom of the first depression in order to insure contact with the bottom electrode 24 of the varistor 18.

The body 38 is desirably molded with a support 42 for the second contact 44 which may be made from an electrically conductive spring wire so that it is spring biased downwardly into contact with the upper electrode 22 of the disc varistor 18. The contact extends through the support 42 to provide a second electrical lead 46 of the mount.

Figure 4:
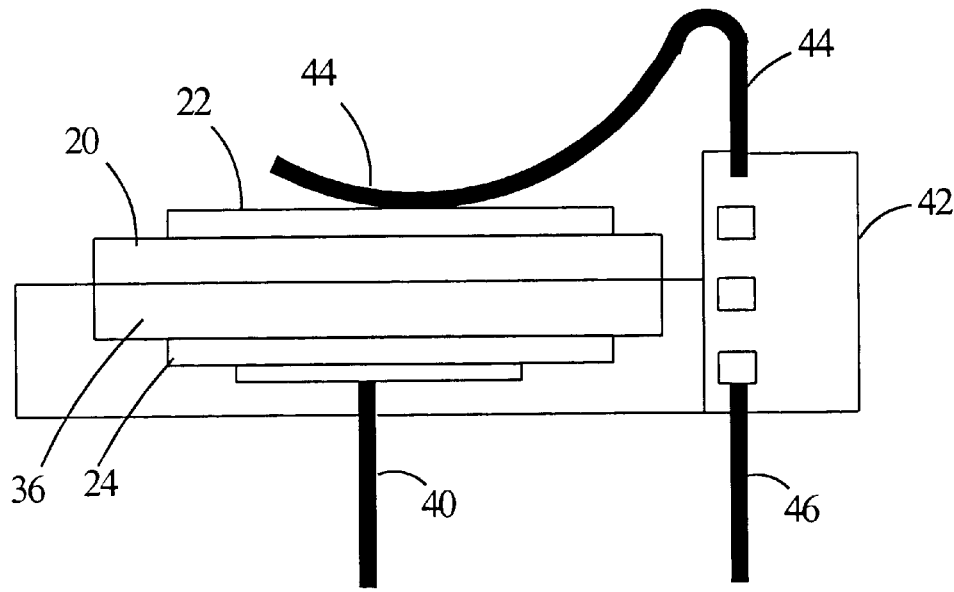
FIG. 4 is a side view in elevation of a second embodiment of the surface mount of the present invention.

As shown in FIG. 4, the leads 40 and 46 may extend downwardly so as to penetrate through a printed circuit board for electrical connection to an electrical circuit on the lower side thereof.

As described more fully in applicant's copending application Serial No. filed concurrently herewith for "Thermally Protected Metal Oxide Varistor And Method", the disclosure of which is hereby incorporated herein by reference, thermal protection may be provided by a third contact 50 which may be constructed in the same manner as the contact 44 to provide a third lead 52, but which includes a thermal element 54 covering at least a portion of the contact 50 to prevent contact with the upper electrode 22 of the varistor 18. The thermal element 54 may be any suitable conventional insulator responsive to excessive heat in the varistor to either physically dissipate or to lose its insulative characteristics. An example of such a thermally reactive insulator is benzanilide. Benzanilide is generally rigid up to its melting temperature, which is generally in the range of 150–200° C. and is preferentially 163° C. Benzanilide adheres well and breaks down at its melting temperature to a viscosity that is water-like. It has been found desirable for the body 36 to include a second support 56 at the end of the mount opposite to the support 42 to lend rigidity to the contact 50.

Figure 6:
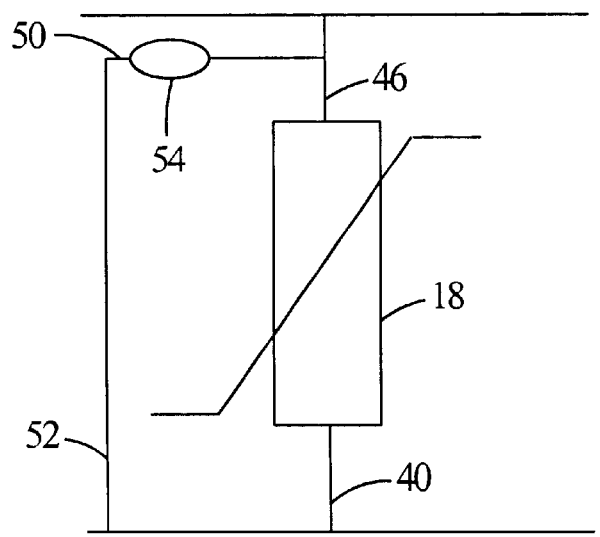
FIG. 6 is a schematic circuit diagram of the varistor and switch of FIGS. 3 and 4 with a fuse in series with the varistor.

The circuit including the third contact 50 is shown in FIG. 6 where a shorting circuit is shown with the leads 52 and 40 electrically connected. Under normal operating conditions, current flows through the varistor 18 via the leads 40 and 46. An undesirable thermal condition in the varistor 18 caused by a excessive current through the varistor from a sustained overvoltage condition across the varistor, or by a high current pulse through the varistor which causes an internal short in the varistor but does not cause the varistor to destruct, i.e., to open circuit. In the event of such an undesirable thermal, the effective disappearance of the insulating means 54 in response thereto permits contact between the electrode 50 and the upper electrode 22 of the varistor and effects a short circuit across the varistor 18.

While the spring wire contact has been found desirable, it is to be noted that other biasing means may be adequate, e.g., a discrete spring for the electrical contact or a magnet. The shape of the varistor is not a part of this invention, and it may be square or other forms as desired so long as the depression in the body of the mount is compatible.

Figure 8:
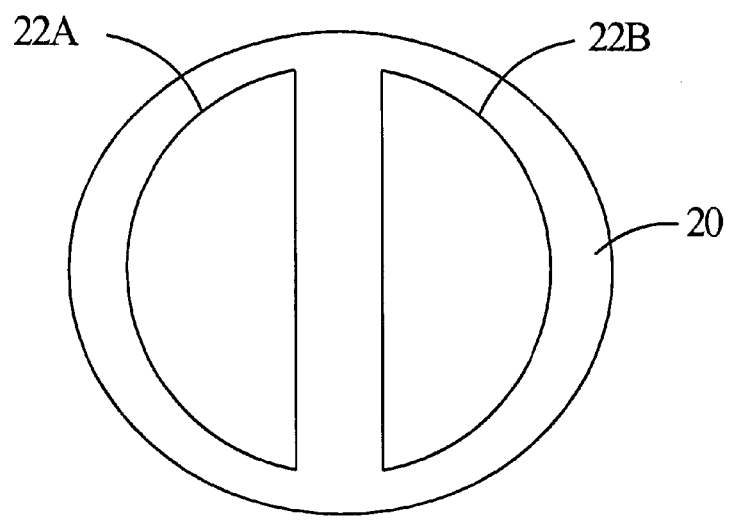
FIG. 8 is a top plan view of a two component electrode compatible with the mount of FIG. 7.

However, the mount of the present invention finds particular utility where the disc varistor electrodes are segmented as shown, e.g., in FIG. 8. With reference to FIG. 8, one of the electrodes, e.g.,the upper electrode 22, may be segmented into two, three or four parts, each forming a varistor element with the single lower electrode 24.

Figure 7:
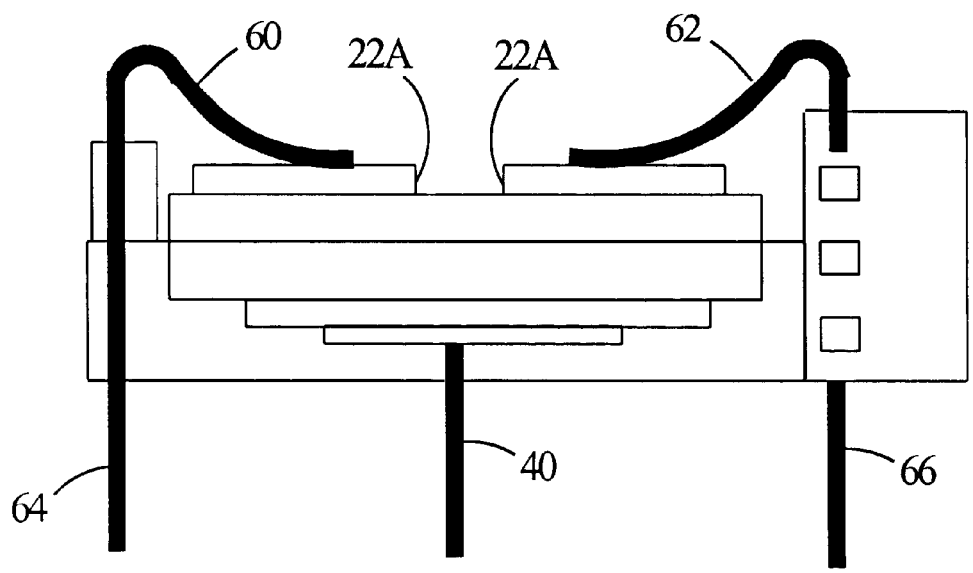
FIG. 7 a side view in elevation of a third embodiment of the surface mount of the present invention adapted for two electrodes on the upper surface of the varistor.
Figure 9:
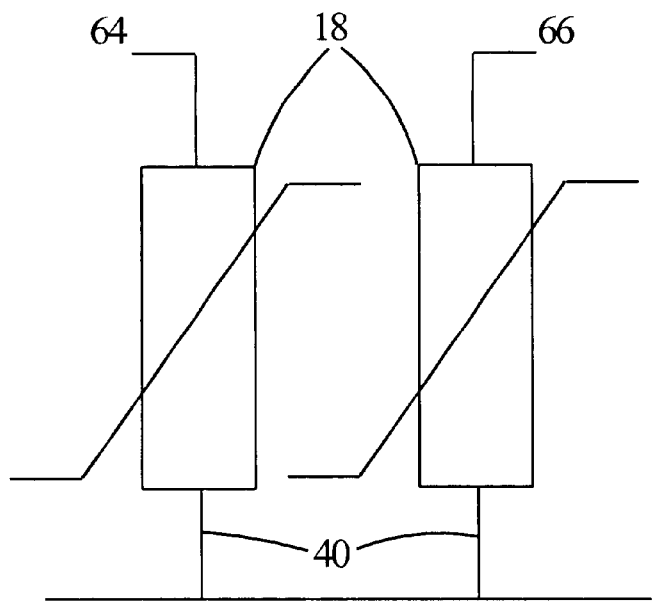
FIG. 9 is a schematic circuit diagram of the varistor of FIG. 8.
Figure 10:
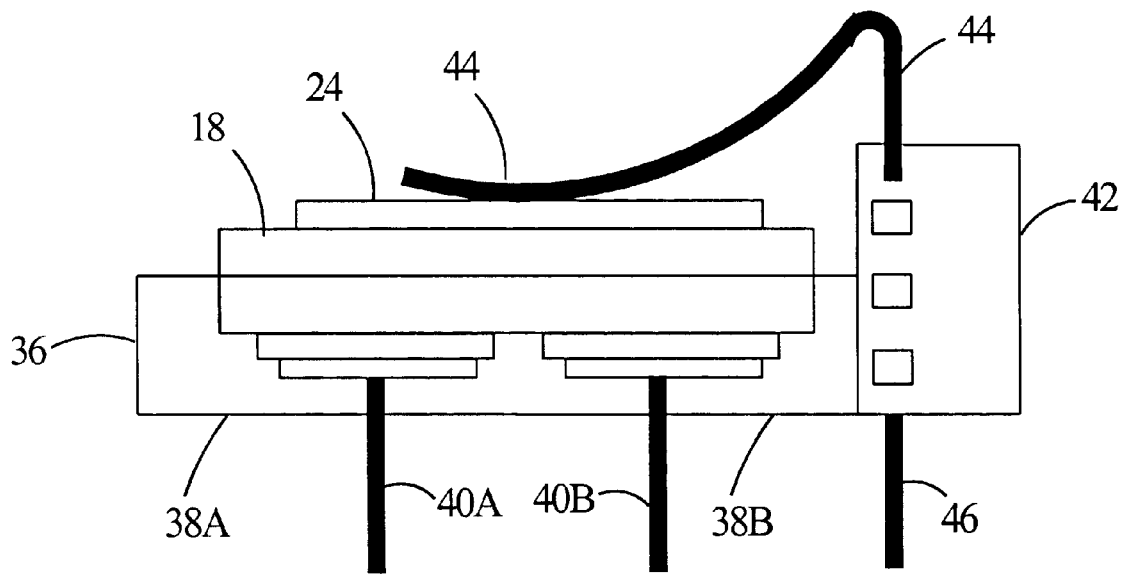
FIG. 10 is a side view in elevation of a fourth embodiment of the surface mount of the present invention adapted for two electrodes on the lower surface of the varistor.

As shown in FIG. 7, an embodiment with two segments on the upper electrode may use two spring wire contacts 60, 62 connected respectively to leads 64, 66 to form the circuit shown in FIG. 9. As shown in FIG. 10, the identical circuit may be formed using the two segment varistor of FIG. 8 with the segmented electrode facing downwardly and a single contact 44 in contact with the single, now upper, electrode 24. This embodiment requires that the body 36 include not one central contact 38 as illustrated in FIG. 3A, but two spaced contacts 38A and 38B as shown in FIG. 10.

While preferred embodiments of the present invention have been described, it is to be understood that the embodiments described are illustrative only and that the scope of the invention is to be defined solely by the appended claims when accorded a full range of equivalence, many variations and modifications naturally occurring to those of skill in the art from a perusal hereof.

What is claimed is:

1. A mount adapted for receiving an electrical component having exposed upper and lower electrodes comprising:

an insulative body with an upwardly open receptacle adapted to receive the electrical component;

a lower contact carried by said body in position to contact the lower electrode of the component when received in said receptacle;

an upper contact carried by said body above said receptacle in position to contact the upper electrode of the component when received in said receptacle, said upper contact being downwardly biased toward said receptacle;

a second upper contact carried by said body above said receptacle in position to contact a second upper electrode of the component when received therein, said second upper contact being downwardly biased toward said receptacle and electrically connected to said lower electrical contact; and a thermally responsive insulator between said second upper contact and the upper electrode of the electrical component for preventing contact there between under predetermined thermal conditions, said insulator being responsive to a predetermined thermal condition to permit contact between said contact and the upper electrode of the component.

2. The mount of claim 1 wherein said second upper contact is a metal spring.

3. The mount of claim 1 wherein said insulator melts at temperatures above a predetermined value.

4. The mount of claim 1 wherein the insulator deteriorates between 150–200° C.

5. The mount of claim 1 wherein the insulator deteriorates at 163° C.

6. The mount of claim 1 wherein the insulator consists essentially of benzanilide.

7. The mount of claim 1 wherein said predetermined thermal condition is caused by an excessive current condition through the electrical component that does not cause the electrical component to destruct.

8. The mount of claim 7 wherein said excessive current condition is caused by a sustained overvoltage condition in the electrical component.

9. The mount of claim 7 wherein said excessive current condition is caused by a high current pulse through the electrical component.

10. The mount of claim 7 wherein said component is a varistor.

11. A method of shorting out an electrical component having exposed upper and lower electrodes when said electrical component is exposed to a predetermined thermal condition, comprising the steps of:

(a) disposing the electrical component in an insulative body adapted to receive the electrical component;

(b) providing a lower contact carried by said body in position to contact the lower electrode of the component when received therein;

(c) providing an upper contact carried by said body above said receptacle in position to contact the upper electrode of the component when received therein, said upper contact being downwardly biased toward said receptacle;

(d) providing a second upper contact carried by said body above said receptacle in position to contact a second upper electrode of the component when received therein, said second upper contact being downwardly biased toward said receptacle and electrically connected to said lower electrical contact; and (e) positioning a thermally responsive insulator between said second upper contact and the upper electrode of the electrical component for preventing contact there between under predetermined thermal conditions, said insulator being responsive to a predetermined thermal condition to permit contact between said contact and the upper electrode of the component thereby shorting out said electrical component.

12. The method of claim 11 wherein said second upper contact is a metal spring.

13. The method of claim 11 wherein said insulator melts at temperatures above a predetermined value.

14. The method of claim 11 wherein the insulator deteriorates between 150–200° C.

15. The method of claim 11 wherein the insulator deteriorates at 163° C.

16. The method of claim 11 wherein the insulator consists essentially of benzanilide.

17. The method of claim 11 wherein said predetermined thermal condition is caused by an excessive current condition through the electrical component that does not cause the electrical component to destruct.

18. The method of claim 17 wherein said excessive current condition is caused by a sustained overvoltage condition in the electrical component.

19. The method of claim 17 wherein said excessive current condition is caused by a high current pulse through the electrical component.

20. The method of claim 11 wherein said component is a varistor.

21. A surface mount adapted for receiving a disc shaped electrical varistor having exposed substantially planar upper and lower electrodes comprising:

an insulative body with an upwardly open substantially cylindrical receptacle adapted to receive the electrical varistor;

a substantially planar lower contact carried by said body in the bottom thereof in position to contact the lower electrode of the varistor when received in said receptacle;

an upper contact carried by said body above said receptacle in position to contact the substantially planar upper electrode of the varistor when received in said receptacle, said upper contact being a metal spring downwardly biased toward said receptacle;

a second upper contact carried by said body above said receptacle in position to contact a second upper electrode of the varistor when received therein, said second upper contact being a metal spring, being spaced from said first upper electrode, being downwardly biased toward said receptacle and being electrically connected to said lower electrical contact; and a thermally responsive insulator between said second upper contact and the upper electrode of the varistor for preventing contact therebetween at a temperature below about 150–200° C.

22. The mount of claim 21 wherein the insulator consists essentially of benzanilide and wherein said predetermined thermal condition is responsive to a non-destructive current condition through the electrical component from either a sustained overvoltage condition in the electrical component or a high current pulse through the electrical component.

* * * * *